United States Patent [19]

Matsuzaka et al.

[11] 4,382,182

[45] May 3, 1983

[54] METHOD OF DISPLAYING AN IMAGE OF PHASE CONTRAST IN A SCANNING TRANSMISSION ELECTRON MICROSCOPE

[75] Inventors: Takashi Matsuzaka, Kokubunji; Hideo Todokoro, Hinodemachi, both of Japan

[73] Assignee: Hitachi, Ltd., Tokyo, Japan

[21] Appl. No.: 266,290

[22] Filed: May 22, 1981

[30] Foreign Application Priority Data

May 26, 1980 [JP] Japan .................................. 55-68969

[51] Int. Cl.³ ............................................. H01J 37/28
[52] U.S. Cl. .................................... 250/307; 250/311; 250/397
[58] Field of Search ................ 250/310, 311, 307, 397

[56] References Cited

U.S. PATENT DOCUMENTS 3,908,124  9/1975  Rose ..................................... 250/310

Primary Examiner—Alfred E. Smith
Assistant Examiner—Carolyn E. Fields
Attorney, Agent, or Firm—Antonelli, Terry & Wands

[57] ABSTRACT

A method of and apparatus for displaying an image of phase contrast in a scanning transmission electron microscope, in which an electron beam flux transmitted through a specimen is deflected with a high frequency and repeatedly moved on an aperture provided in a region where a transmitted electron beam and a scattered electron beam interfere, and among signal components detected by a detector through the aperture, only a signal synchronous with the high frequency is sampled and detection-rectified, whereby the difference of the intensities of the region where both the electron beams interfere is detected so as to display the image of phase contrast of the specimen.

6 Claims, 9 Drawing Figures

METHOD OF DISPLAYING AN IMAGE OF PHASE CONTRAST IN A SCANNING TRANSMISSION ELECTRON MICROSCOPE

A method of and apparatus for displaying an image of phase contrast in a scanning transmission electron microscope.

BACKGROUND OF THE INVENTION

This invention relates to improvements in a method of and apparatus for displaying an image of phase contrast in a scanning transmission electron microscope (STEM).

In general, an image of phase contrast in a scanning transmission electron microscope is obtained with a method in which a small aperture is provided between a specimen and a detector so as to narrow a detecting angle.

FIG. 1 is a diagram showing the outline of the method. In case of illuminating a specimen 2 (hereinafter, a phase object having a grating-like structure shall be considered as an ideal specimen) with a primary electron beam 1, electron beams transmitted through the specimen 2 can be divided into scattered electron beams 3 generated by scattering within the specimen 2 and a transmitted electron beam 4 transmitted through the specimen 2 without interacting therewith. Each scattered electron beam 3 involves a phase shift relative to the transmitted electron beam 4 on account of the scattering within the specimen. The phase contrast causes the scattered electron beam 3 and the transmitted electron beam 4 to interfere when they overlap each other. It is a part 5 that is subjected to the interference. Since information on the phase contrast is obtained through the interference phenomenon, the variation of the intensity of the electron beam in the interfering region 5 needs to be detected in order to form an image of phase contrast. To this end, there has been adopted an expedient in which an aperture plate 6 is inserted into the interfering region 5 to confine a narrow detecting angle and to enhance the coherence, whereupon a signal is obtained. This expedient has realized optically the same condition as that in the case of forming an image of phase contrast in a transmission electron microscope (TEM). The intensity of the electron beam having passed through an aperture 6' of the aperture plate 6 is detected by a detector 7. The detected signal is amplified by an amplifier 8, and is supplied for the intensity modulation of a CRT (cathode-ray tube) 9. On the other hand, the scanning on the screen of the CRT 9 is synchronous with the scanning of the primary electron beam which is effected by a power supply for scanning 10 and deflection coils 11 (in the figure, the arrow 12 indicates the direction of the scanning on the specimen 2). Therefore, an image including the information of the phase contrast is formed on the screen of the CRT 9. This is the so-called image of phase contrast.

However, the image of the phase contrast acquired with this method is of the superposition between the contrast based on the phase shift (phase contrast) and the contrast (bright field image) ascribable to the decay of the electron-beam intensity occurring when the primary electron beam is transmitted through the specimen. It is not an image which consists only of the information of the phase shift.

As an expedient for improving the drawback, there has been proposed a method in which only the phase contrast is emphasized to display an image (refer to Optik, vol. 41, p. 452–456, 1974). This method is characterized in that two detectors are used to construct a new detector system without disposing the aperture plate 6.

FIG. 2 is a top plan view of the detector system in this method. Detectors (I) and (II) have their detecting faces arranged so as to lie in contact with each other through a straight line 1 within an identical plane. When they are installed at the position of the detector 7 in FIG. 1, the spots of the electron beams transmitted through the specimen become as shown by three circles in FIG. 2. In the figure, numeral 14 designates the spot formed by the transmitted electron beam, numerals 13 and 13' indicate the spots formed by the scattered electron beams, and hatched parts A and B are the interfering regions. With the detector system thus constructed, the difference between the electron-beam intensities detected by the respective detectors (I) and (II) is taken. Then, since the bright field images are isotropic, they are canceled, and only the difference (A−B) of the electron-beam intensities in the interfering regions A and B can be derived as a signal. Accordingly, an image of phase contrast formed by the use of this signal consists only of the information of the phase shift.

With such detector system, however, the two detectors are required, which gives rise to such disadvantages (1) that the coadjustments between the detectors are necessary, (2) that the mechanical butt of the detecting faces of the two detectors needs to be precise, and (3) that since the symmetry with respect to an optical axis is necessary, the axial alignment is necessitated, resulting in complicated operations.

SUMMARY OF THE INVENTION

This invention has been made with note taken of the above-mentioned drawbacks, and has for its object to provide a novel method of displaying an image of phase contrast in a scanning transmission electron microscope, the method making it possible to readily observe the image of phase contrast.

In order to accomplish the object, according to this invention, a method of and apparatus for displaying an image of phase contrast in a scanning transmission electron microscope wherein the difference between electron-beam intensities in regions in which an electron beam resulting from the transmission-through-a-specimen of a primary electron beam illuminating the specimen and electron beams caused by scatterings within the specimen interfere is detected, thereby to display the image of phase contrast of the specimen, is so constructed that an electron beam flux transmitted through the specimen is deflected with a high frequency and repeatedly moved on an aperture plate disposed in the interfering region, and that among signal components detected by a detector through the aperture plate, only a signal synchronous with the high frequency is sampled and detection-rectified, thereby to detect the difference of the intensities of both the electron beams.

DETAILED DESCRIPTION OF THE PREFERRED EMBODIMENTS

Hereunder, this invention will be described in detail with reference to preferred embodiment.

Figure 3:
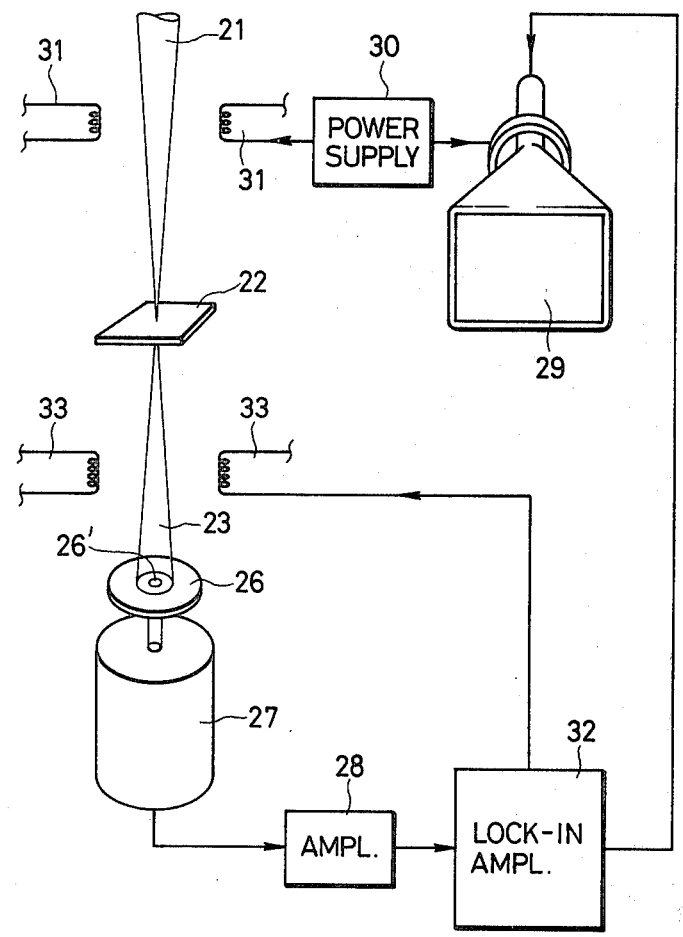
FIG. 3 is a schematic view for explaining an embodiment of this invention.
Figure 4A:
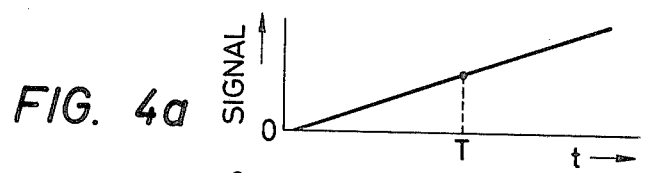
FIGS. 4(a) to 4(f) are waveform diagrams showing signals in various parts of the construction in FIG. 3.
Figure 4B:
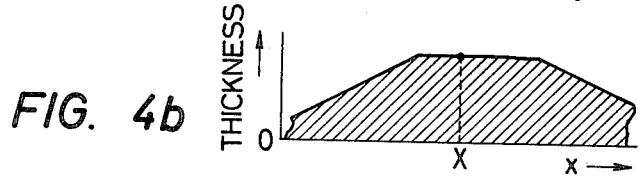
Figure 4C:
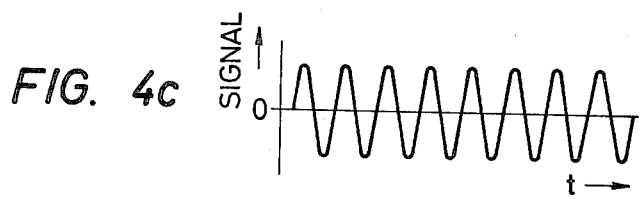

FIG. 3 is a view of an exemplary embodiment of this invention, while FIGS. 4(a)-4(f) are waveform diagrams showing signals in various parts of the embodiment. In FIG. 3, a primary electron beam 21, which is focused to a beam, fine is scanned in two dimensions on a specimen 22 by deflection coils 31. FIG. 4(a) shows an example (saw-tooth wave) of a signal which is supplied from a scanning power supply 30 to the deflection coil 31 at that time. FIG. 4(b) shows that part of the specimen which is scanned by the primary electron beam according to FIG. 4(a) within the corresponding period of time; for example, at a time T in FIG. 4(a), the primary electron beam lies at a position X on the specimen, as seen in FIG. 4(b). A deflector 33 for deflecting the electron beam flux 23 transmitted through the specimen is disposed between the specimen 22 and an aperture plate 26. The deflector is supplied with a radio frequency of, for example, approximately 10 KHz, as shown in FIG. 4(c), to deflect the electron beam flux 23 after the transmission through the specimen in one direction or in two dimensions.

Here, the distance which the primary electron beam is scanned (moved) on the specimen within at least one cycle of the radio frequency needs to be less than the resolution of the apparatus (STEM). That is, letting d denote the resolution of the apparatus, v denote the scanning velocity of the primary electron beam on the specimen, and f denote the frequency of the radio-frequency signal applied to the deflector 33, the inequality of $v/f < d$ needs to be met. Accordingly, by way of example, in the case where the resolution d of the apparatus is 3 angstroms (A), where the cycle of the saw-tooth wave (FIG. 4(a)) to scan the primary electron beam is approximately 100 msec. for the display of an image of phase contrast and where the scanning velocity v of the primary electron beam on the specimen at this time is approximately $10^{-4}$ cm/sec., the frequency f may be greater than 10/3 kHz. Therefore, supposing by way of example that the deflector 33 is supplied with 10 kHz as stated above, this is effective to deflect the electron beam flux 23 after the transmission through the specimen, for three cycles at every point of the specimen 22.

Figure 4D:
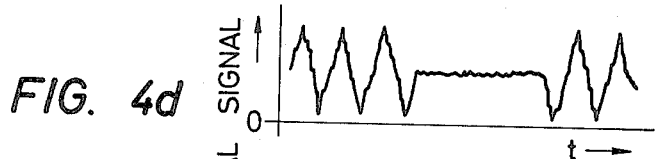

The electron beam flux 23, which is deflected by the radio frequency in a manner to be repeated, unidirectionally crosses an aperture 26' of an aperture plate 26 continuously and iteratively, and it executes one reciprocation on the surface of the aperture plate 26 with respect to one cycle of the radio frequency supplied to the deflector 33. Only electrons which have passed through the aperture plate 26 are detected by a detector 27 (for example, a photomultiplier tube). Accordingly, the signal which is detected by the detector 27 through the aperture plate 26 is attended with time fluctuations in correspondence with the intensity distribution of the electron beam flux 23 as illustrated in FIG. 4(d). In this regard, when the beam scans a portion of the specimen which changes in thickness, the detected signals produce a phase shift. Thus, in the sample as shown in FIG. 4b, the signals detected when the beam scans one portion of the specimen in which the gradient of thickness changes from positive to zero will be opposite in phase from signals detected when the beam scans the other portion of the specimen in which the gradient of thickness changes from zero to negative. Also, when the beam scans a portion of the specimen having a constant thickness, as shown in the center of FIG. 4b, the detected signals do not produce a phase shift, but become constant, as shown by the flat portion of the signals in FIGS. 4d and 4e.

Figure 4E:
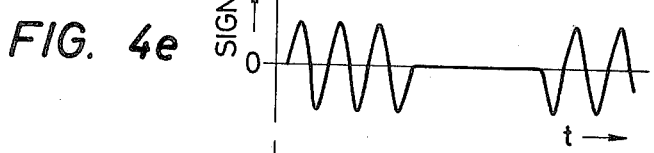
Figure 4F:
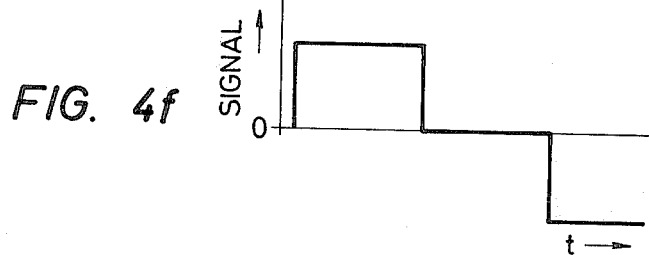

When, among the components of the signal, the component (FIG. 4(e)) synchronized with the radio frequency supplied to the deflector 33 is noticed, it is none other than a result obtained in such a way that, in the foregoing method employing the two detectors, the electron beam flux 23 is divided into two symmetrical parts, whereupon the electron-beam intensities of the respective parts simultaneously detected are derived alternately in time (in time division).

Accordingly, the magnitude from the top to the bottom of the signal waveform shown in FIG. 4(e) and synchronized with the radio frequency supplied to the deflector 33 corresponds to the difference between the electron-beam intensities of the two symmetrical parts. Therefore, a square wave signal (FIG. 4(f)) obtained by detection-rectifying the waveform of FIG. 4(e) has the same nature as that of the difference signal detected by the use of the two detectors as stated before.

The signal thus obtained is supplied for the intensity modulation of a CRT 29. On the other hand, the scanning on the screen of the CRT 29 is synchronous with the scanning of the primary electron beam executed by the scanning power supply 30 and the deflection coils 31. Therefore, an image of phase contrast identical in nature to that obtained by the foregoing system of dividing the detecting surface into the two parts is formed on the screen of the CRT 29.

The above-stated functions of supplying the radio frequency to the deflector 33, sampling the component synchronous with the radio frequency and carrying out the detection-rectification may well be realized with means separate from one another, but they can be provided as well by a lock-in amplifier 32, which is a well-known form of synchronous detector using a balanced amplifier. Thus, when an output signal from the lock-in amplifier 32 is used for the intensity modulation of the CRT 29, the image of phase contrast identical in nature to that obtained by the foregoing method employing the two detectors is formed on the screen of the CRT 29. In FIG. 3, numeral 28 indicates an amplifier for amplifying the signal detected by the detector 27.

Figure 1:
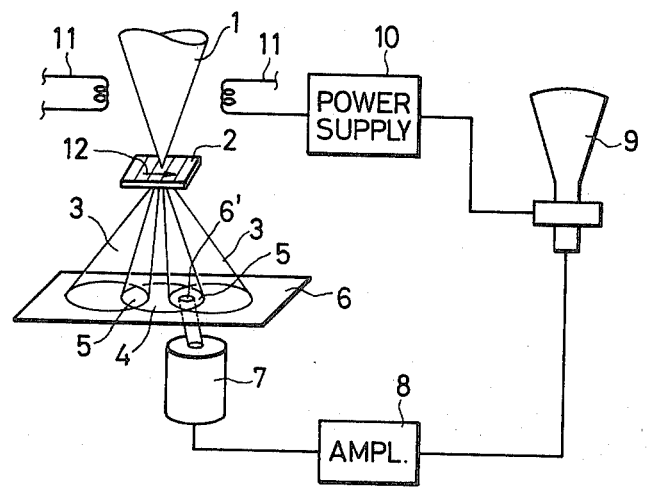
FIG. 1 is a view showing the outline of a prior-art method.
Figure 2:
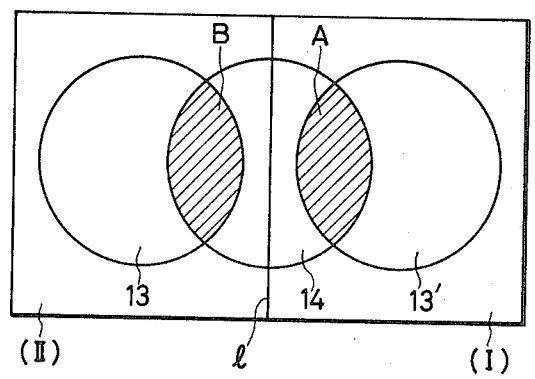
FIG. 2 is a top plan view of a detector system in another prior art.

In the above embodiment, the case of employing the ideal specimen has been referred to in order to facilitate understanding of this invention. Needless to say, however, the basic principle holds as to general specimens. The aperture of the aperture plate 26 in the embodiment can be optionally selected as long as it has a geometry which can be received within the region A or B illustrated in FIG. 2. In addition, when the aperture plate 26 is provided as a movable aperture plate having a plurality of apertures and the optimum aperture is selected depending upon the condition of the specimen, etc., an appropriate condition for detecting the signal is established. Further, although the embodiment has referred to the case where the electron beam flux after the transmission through the specimen is deflected at the radio frequency unidirectionally, the invention is also applicable, in principle, to the case where it is deflected at the radio frequency in two dimensions.

As set forth above, in comparison with the foregoing prior-art system of dividing the detecting surface into two parts, this invention has various advantages in that (1) the single detector suffices, so the structure is simplified, (2) any strict axial alignment with the optical axis of the detector system is not required, so that the operability of the system is enhanced, and (3) the handling of the signals can be fully effected by the lock-in amplifier, so surplus adjustments are dispensed with. The invention is greatly effective when put into practical use.

What is claimed is:

1. A method of displaying an image of phase contrast in a scanning transmission electron microscope, which comprises the steps of:

illuminating a specimen with a primary electron beam, deflecting a flux of electron beams transmitted through said specimen with high frequency, said flux of electron beams comprising a transmitted electron beam and scattered electron beams, so that said flux of electron beams is reciprocated on an aperture provided in an interfering region of said transmitted electron beam and said scattered electron beams, using a detector to detect electron beams that have passed through said aperture, said detector providing signals representative of said detected beams, picking out from the detector signals a signal component synchronized with said high frequency, detection-rectifying the synchronized signal component, and supplying the detection-rectified signal as an intensity modulation signal to a display equipment.

2. A method according to claim 1, wherein said step of deflecting is effected using a deflector between said specimen and said aperture, said deflector deflecting said flux of electron beams, and using a power supply for supplying high frequency to the deflector.

3. A method according to claim 2, comprising using a lock-in amplifier to supply the power at said high frequency to said deflector, to pick out said signal component synchronized with the high frequency from said detector signals, and to detection-rectify said synchronized signal component.

4. In a scanning transmission electron microscope, apparatus for displaying an image of phase contrast comprising means for illuminating a specimen with a primary electron beam;

deflecting means for deflecting at high frequency a flux of electron beams transmitted through said specimen as a result of said primary electron beam, said flux of electron beams including a transmitted electron beam and scattered electron beams;

an aperture plate having an aperture disposed in an interfering region of said transmitted electron beam and said scattered electron beams, said flux of electron beams being reciprocated at said high frequency across said aperture;

detector means for detecting the electron beams passing through said aperture and producing an output signal representative thereof;

signal processing means for picking out a signal component of said output signal which is synchronized with said high frequency and detection-rectifying said synchronized signal component; and display means for displaying said detection-rectified signal.

5. Apparatus according to claim 4, wherein said signal processing means is provided as a lock-in amplifier.

6. Apparatus according to claim 4, wherein said illuminating means includes means for scanning said primary electron beam on said specimen with a velocity v, and wherein said high frequency is such that $$v/f < d$$

with f being equal to said high frequency and d being equal to the resolution of the electron microscope.

* * * * *